United States Patent [19]

Barter

[11] 4,165,508

[45] Aug. 21, 1979

[54] METHOD AND APPARATUS FOR DETECTING A PEAK VALUE OF AN ANALOG SIGNAL

[75] Inventor: LeRoy D. Barter, Fullerton, Calif.

[73] Assignee: Beckman Instruments, Inc., Fullerton, Calif.

[21] Appl. No.: 882,286

[22] Filed: Feb. 28, 1978

[51] Int. Cl.² ............................................. H03K 13/02
[52] U.S. Cl. .......................... 340/347 AD; 324/103 P; 307/351; 235/92 CA
[58] Field of Search ............... 340/347 M; 324/103 P; 235/92 CA, 92 FP; 307/351

[56] References Cited

U.S. PATENT DOCUMENTS

| | | | |
|---|---|---|---|
| 3,412,241 | 11/1968 | Spence et al. | 324/103 P |
| 3,808,407 | 4/1974 | Ratz | 235/92 FP |
| 3,878,984 | 4/1975 | Sotiropoulos et al. | 324/103 P |
| 3,924,078 | 12/1975 | Bussey | 324/103 P |
| 3,973,197 | 8/1976 | Meyer | 324/103 P |
| 4,011,509 | 3/1977 | Edwards | 235/92 CA |

Primary Examiner—Malcolm A. Morrison
Assistant Examiner—Gary Chin
Attorney, Agent, or Firm—Robert J. Steinmeyer; Robert R. Meads; John R. Shewmaker

[57] ABSTRACT

Apparatus for detecting a peak value of an analog signal includes a first counter for counting pulses from a digital clock for successive samplings of the analog signal to convert each sample of the analog signal into digital form and a counting register into which the pulse count in the first counter is transferred to be recounted at a later sampling. With a prior digital count in the register, the digital clock simultaneously (1) increments the counter to count the current signal sampling and (2) decrements the register to zero to recount the prior signal sampling. The counter is constrained to count up until both counting and recounting steps are complete before the count in the counter is transferred to the register. In this manner the counter will always attain the greater of the current and the prior sampling pulse count values and this maximum value will always be transferred into the register. A peak is signaled when the prior maximum pulse count exceeds current pulse counts for a predetermined number of successive samplings.

4 Claims, 2 Drawing Figures

METHOD AND APPARATUS FOR DETECTING A PEAK VALUE OF AN ANALOG SIGNAL

BACKGROUND OF THE INVENTION

1. Field of the Invention

The present invention relates generally to the measurement of peak values of analog signals and, more particularly, to a method and apparatus for detecting the peak value of an analog signal which has been converted into digital form. The invention is particularly well suited for but not limited to use with analog-to-digital converters of the dual-slope integrating type.

2. Description of the Prior Art

A variety of analog and digital techniques exist for detecting peak values of analog signals. In a common analog technique the rate of change of the analog signal is developed and a peak is indicated when the rate of change passes through zero. However, this analog arrangement is unreliable at low input signal levels since the rate signal developed from a low analog signal may be insufficient to operate the zero pass-through detector. In addition, the zero detector is subject to the well known d.c. offset problems of amplifier circuits. Moreover, it is possible for noise or random variations of the input to be detected as peaks.

Common digital techniques typically employ an analog-to-digital converter, such as a dual-slope integrating converter, for converting the analog signal into digital form in combination with circuitry for analyzing the digital information to determine if a peak has been attained. Such converters typically include a digital pulse source together with counting and timing means for generating the digital pulse counts, a buffer register of some kind for temporarily storing pulse count values, and a display for displaying the pulse count values stored in the buffer register. While the digital arrangements will satisfactorily detect peak values, they are unduly complicated and require extensive additional circuitry beyond that required to execute the analog-to-digital conversion itself.

SUMMARY OF THE INVENTION

The present invention resides in a method and apparatus for detecting the peak value of an analog signal using digital techniques which overcomes the disadvantages of the prior art approaches. The invention is compatible with conventional analog-to-digital converters and adapts such converters for peak detection without the need for further digital storage capacity and with minimum additional control circuitry.

To these ends, the present invention resides in apparatus for measuring an analog signal of the type including converter means for sampling the signal at successive times and having counting means for counting pulses from a source of digital pulses to develop a digital pulse count for each sampled analog amplitude value. The converter means further generates a first timing signal at the end of each conversion for transferring the count then attained in the counting means into storage register means. In accordance with a primary aspect of the invention, the storage register means is provided (1) for storing a prior digital pulse count corresponding to an amplitude value at a prior sampling time, (2) for recounting the prior digital pulse count stored therein, and for (3) generating a second timing signal when the recount is complete. The register means is enabled for recounting the prior digital pulse count following a current sampling simultaneous with the counting means counting toward the current digital pulse count for the current sample. The counting means is constrained such that it may count beyond the digital pulse count of the current sampling. Timing means responds to the later occurring of the first and second timing signals for storing the digital pulse count then attained by the converter means in the register means.

As a result of the foregoing arrangement, the converter means always counts to the current pulse count value or to the recounted value, whichever is greater. Consequently, before a digital pulse count is transferred to the register means for storage, it will correspond to the maximum pulse count value of all preceding samplings of the analog signal.

For each sampling, logic circuitry monitors the order of the first and second timing signals signalling completion of the respective counting and recounting operations and signals the occurrence of a peak when the current pulse count value is less than the recounted pulse count value, and hence less than the maximum pulse count to that point, for a predetermined number of successive samplings.

The register means additionally functions as a buffer register for a display or other output device for displaying the contents of the register means, and hence for displaying the peak value of the analog signal. Moreover, if peak detection is not desired at any point, the system is adapted to convert to a normal analog-to-digital converter to store in the register means each current sampling of the analog signal thus to follow and display the changing amplitude values of the analog signal.

The present arrangement greatly simplifies the adaptation of analog-to-digital converters for peak detection. By adapting the buffer register as part of the peak detecting arrangement the need for additional digital storage capacity and associated circuitry for processing and analyzing the digital pulse signals to determine the peak therein is eliminated, yet while retaining the capability of analog-to-digital conversion without peak detection.

DESCRIPTION OF THE PREFERRED EMBODIMENT

The peak detecting method and apparatus of the invention will be described as incorporated with a dual-slope analog-to-digital converter, and the converter will be described only to the extent necessary for an understanding of the present invention. It will be understood that the principles of construction and operation of dual-slope converters are well established in the art. Reference is made to "Analog-Digital Conversion Handbook," Analog Devices, Inc., Norwood, Mass. (1972) for background and further details regarding such converters.

Figure 2:
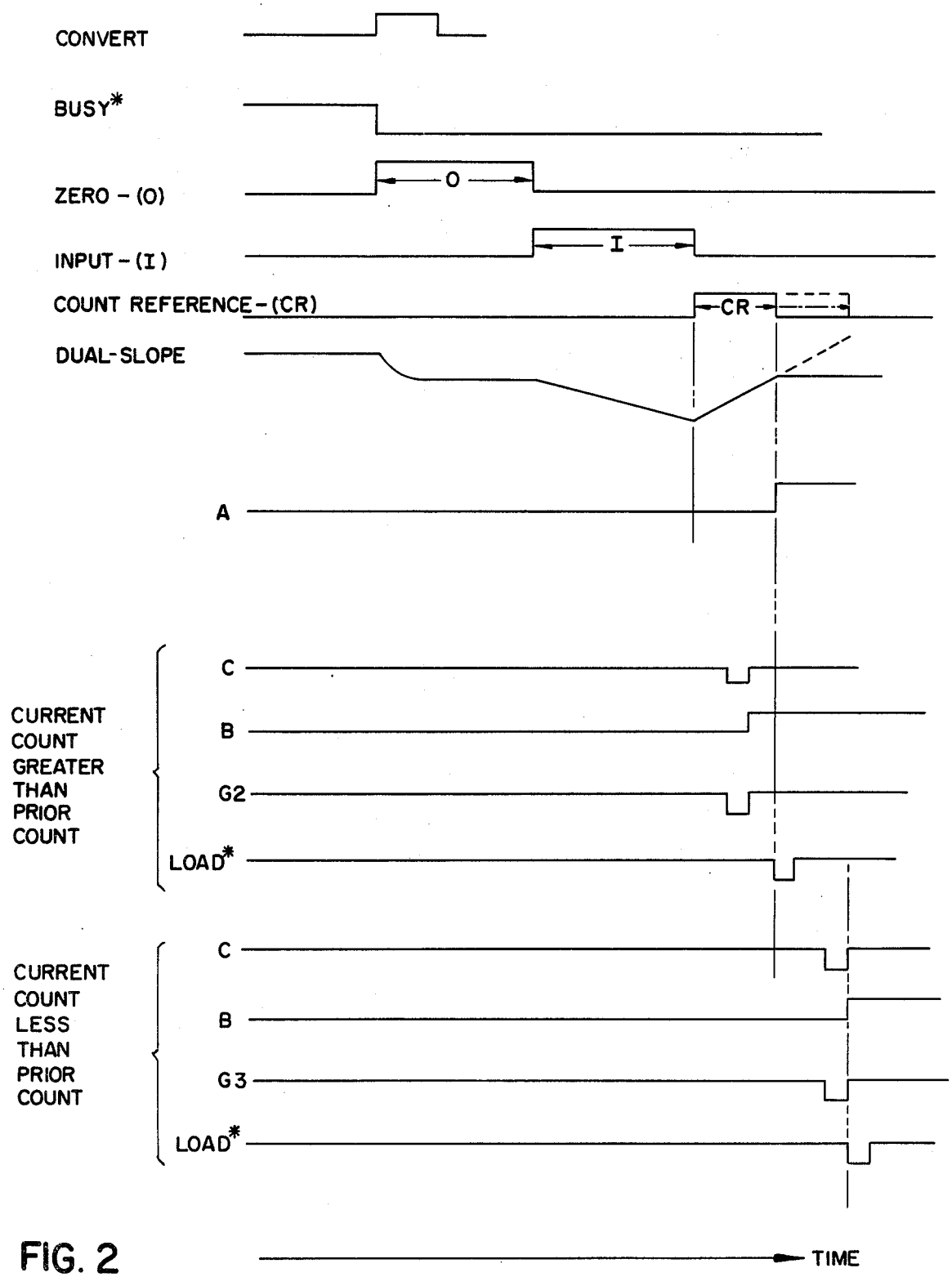
FIG. 2 is a graphical representation with respect to time of various timing and control signals controlling operation of the apparatus of FIG. 1.

Briefly, a dual-slope converter functions to sample an analog signal at successive times and to generate respective digital pulse counts corresponding to the magnitude of the analog signal at each sampled time. For this purpose, the converter includes a source of digital pulses in combination with counting and timing means for generating timing signals for controlling converter operation as well as for generating each digital pulse count representative of the sample analog signal magnitude. FIG. 2 illustrates four such timing signals identified as "CONVERT," "ZERO" (0), "INPUT" (IN), and "COUNT REFERENCE" (CR). The "DUAL-SLOPE" waveform illustrates the charging and discharging of an integrating capacitor. Herein, each conversion operation is initiated by the "CONVERT" pulse which goes high from an external command. During interval "ZERO" initial circuit conditions are established or zeroed prior to the conversion operation. At the beginning of the "INPUT" interval the analog input signal is applied to an integrating capacitor (not shown) which is charged thereby for the duration of the "INPUT" interval in the manner illustrated by the "DUAL-SLOPE" waveform. The duration of the "ZERO" and "INPUT" intervals is established by the counter counting a predetermined number of pulses from the digital pulse source. Thereafter, a predetermined reference voltage (not shown) opposite in sign to the input voltage, is applied to the capacitor to discharge the capacitor during the "COUNT REFERENCE" interval in the manner illustrated by the "DUAL-SLOPE" waveform. Simultaneously, the counter resets and continues counting pulses from the pulse source. The time to discharge the capacitor to zero is proportional to the magnitude of the analog input signal and establishes the duration of the "COUNT REFERENCE" interval. Consequently, the number of pulses counted during the "COUNT REFERENCE" interval represents the digital pulse count corresponding to the magnitude of the sampled analog signal. When the capacitor has discharged to zero, a first timing signal identified as "A" changes state and is employed to transfer the count attained in the counter, which is representative of the magnitude of the analog input signal, to a buffer register for display. Conventionally, signal "A" is generated as an end of conversion signal by, for example, the change in state of a zero detector as the capacitor signal reaches zero. Hereinafter, the first timing signal "A," which is generated conventionally in dual-slope converters at the end of a conversion, will be employed as one of the timing signals for detecting a peak value of the analog signal.

The remaining control signals "BUSY*," "C," "B," "G2," "LOAD*" and "G3" illustrated in FIG. 2 are generated by the peak detecting apparatus of the invention and will be discussed subsequently.

Figure 1:
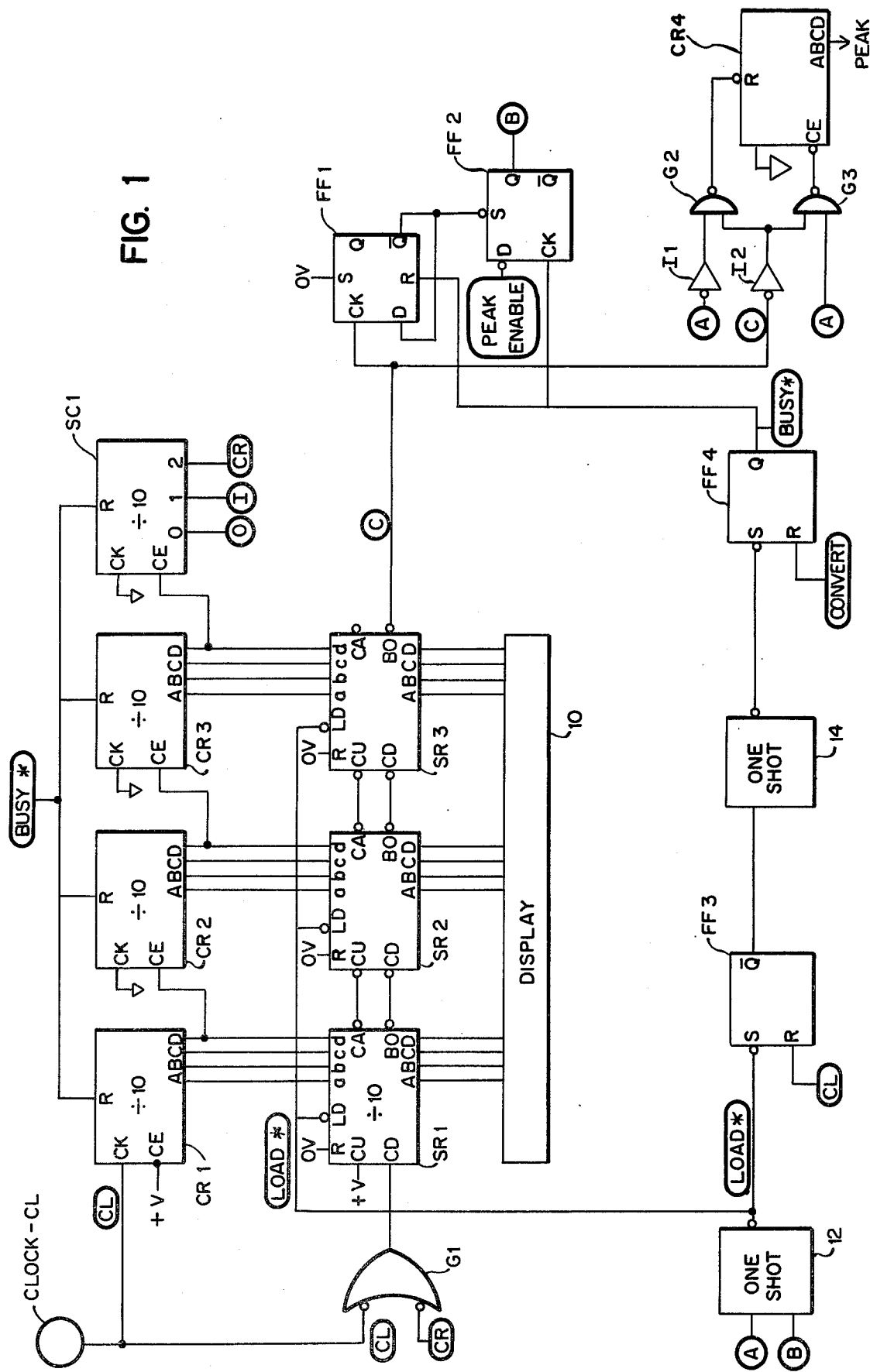
FIG. 1 is a combined schematic and block diagram of the peak detecting apparatus of the present invention.

In FIG. 1, a portion of the conventional converter counting and timing arrangement discussed above is illustrated as combined with the peak detecting apparatus of the present invention. As illustrated, the counting and timing arrangement includes three serially connected BCD counters CR1, CR2, and CR3 and a state counter SC1. The pulse output "CL" from a system clock, such as a free-running multivibrator (not shown), is supplied to the clock input terminal CK of counter CR1. The output terminal of counter CR1 is in turn coupled as an input to counter CR2 and the output terminal of counter CR2 is coupled as an input to counter CR3. The output of counter CR3 is coupled as an input to state counter SC1. The state counter supplies at its respective output terminals the waveforms "0," "I," and "CR" corresponding, respectively, to the "ZERO," "INPUT," and "COUNT REFERENCE" waveforms illustrated in FIG. 2. Each counter CR1–CR3 functions as a divide by 10 counter and hence supplies an output pulse upon receipt of 10 input pulses. Consequently, for each 1000 input pulses to counter CR1 one output pulse is supplied from counter CR3 to advance the state of state counter SC1. Thus, the duration of the intervals defined by the output waveforms from state counter SC1 will be for 1000 clock pulses unless the counters and register are reset by a reset signal at their respective reset terminals R. In the preferred embodiment, the system clock has a clock period of 16.7 $\mu$s. Consequently, the "ZERO" and "INPUT" intervals are each 16.7 ms. It will be understood that the "COUNT REFERENCE" interval will be up to 16.7 ms depending upon the magnitude of the analog signal.

The pulse count value of the sampled analog signal will be that value attained in counters CR1–CR3 at the end of the "COUNT REFERENCE" interval. Since the counters are free-running, and hence may continue to count beyond the end of the "COUNT REFERENCE" interval, it is necessary to transfer the sampled value from the counters. For this purpose each of the counters is also connected in parallel to a one of serially connected respective storage registers SR1, SR2, SR3, and the storage registers are in turn coupled to a suitable display or other utilization device 10. Upon application of a "LOAD*" signal to the respective load terminals LD of each register, the pulse count value in counters CR1–CR3 is transferred in parallel to respective registers SR1–SR3 and displayed by the display. Broadly speaking, dual-slope converters conventionally employ some form of such buffer storage register to temporarily hold the desired pulse count value for display or further processing. The buffer register is typically loaded with the value in counters CR1–CR3 at the end of the "COUNT REFERENCE" interval in response to the change in state of the first timing signal "A" at such time.

In FIG. 1, the remaining features including NAND gate G1, one-shot multivibrator 12, flip-flops FF1–FF4, and counter CR4 comprise the logic and control arrangement for executing the peak detecting function of the present apparatus, and these features will be discussed further below.

In accordance with a primary aspect of the present invention, storage registers SR1–SR3 are adapted to store a pulse count value from counters CR1–CR3 and to recount such value in response to pulses from the system clock. To this end, the clock signal "CL" is supplied as an input to first storage register SR1 through NAND gate G1 which is enabled to pass the clock pulses during the "COUNT REFERENCE" interval by the "COUNT REFERENCE" signal ("CR") supplied as a second input thereto. When a pulse count value has been loaded into registers SR1–SR3, the clock pulses supplied to shift register SR1 decrement the count in the registers toward zero. When the registers have been decremented to zero an output pulse "C" indicative of the zero count is supplied from the output of register SR3. The output of register SR3 is connected to the clock input terminal CK of flip-flop FF1, the $\overline{Q}$ output terminal of which is connected to the set terminal S of flip-flop FF2. Output pulse "C" from the register actuates FF1 and FF2 such that a high signal "B" (FIG. 2), which is effectively a steady state version of the momentary "C" pulse, is supplied at the Q output terminal of FF2. Timing pulse signal "C," and its steady state version "B," represent a second timing signal which will be employed together with the first timing signal "A" to detect a peak value of the analog signal in accordance with the present invention.

In accordance with a further aspect of the invention, storage registers SR1-SR3 are adapted to store the pulse count value generated by a prior sampling for comparison with the pulse count value from a current sampling to determine if the prior value is greater than or less than the current value. This is accomplished by coupling the system clock pulse signal "CL" simultaneously to register SR1 and to counter CR1 to decrement the prior pulse count value in registers SR1-SR3 while simultaneously incrementing counters CR1-CR3 during a current conversion. When the current pulse count value is attained, timing signal "A" goes high to signal the end of the conversion. When registers SR1-SR3 decrement to zero, thus recounting the prior pulse count value, timing signal "B" goes high. It will thus be evident that if the recounted pulse count value of the prior sampling exceeds a pulse count value of the current sampling, signal "A" will change state before signal "B." Conversely, if the current value is greater than the recounted prior value, signal "B" will change state before signal "A."

In accordance with the present invention, the pulse count value attained in counters CR1-CR3 is not transferred to storage registers SR1-SR3 until the change of state of both signals "A" and "B." In this manner, the later occurring of signal "A" and signal "B" controls the transfer of the count in counters CR1-CR3 to storage registers SR1-SR3. To this end, signals "A" and "B" are supplied as respective inputs to one-shot multivibrator 12, the output of which supplies the "LOAD*" pulse to the load terminals LD of registers SR1-SR3. One-shot 12 supplies a low output "LOAD*" pulse only in response to the presence of both high timing signals "A" and "B" at its input terminals. When both signals "A" and "B" go high, the "LOAD" pulse thus generated is supplied to registers SR1-SR3 to load SR1-SR3 with the then digital pulse count value in counter CR1-CR3. Thus the later occurring of timing signals "A" and "B" effects the transfer of the count from CR1-CR3 to SR1-SR3. As a result, the pulse count value in counters CR1-CR3 for the current sampling will be transferred to the storage registers SR1-SR3 only if it exceeds the recounted prior pulse count value, i.e., only if signal "A" is the later occurring signal. If the pulse count value for the current sampling is less than the recounted prior pulse count value, i.e., if signal "B" is the later occurring signal, free-running counters CR1-CR3 continue to count during the "COUNT REFERENCE" beyond the pulse count value for the current sampling toward the prior value. The counters CR1-CR3 reach the prior value simultaneously with registers SR1-SR3 decrementing the prior value to zero and hence simultaneously with the generation of signal "B." Since signal "B" is later than signal "A" in this case, the "LOAD*" signal is generated in response to signal "B" thereby transferring the prior pulse count value from counters CR1-CR3 into registers SR1-SR3 a second time. Consequently, irrespective of whether signal "A" or "B" changes state first, the storage registers SR1-SR3 are always loaded with the maximum pulse count value attained for all of the prior sampling times. Consequently, the pulse count value displayed by display 10 will correspondingly be the maximum value of all prior samplings of the analog signal.

In order to signal the occurrence of a peak in the analog signal, a pulse counter CR4 and associated logic is provided to signal when the maximum prior pulse count value in storage registers SR1-SR3 has exceeded pulse count values of later samplings a predetermined number of successive times. This is accomplished by incrementing the counter one count each time timing signal "A" precedes signal "C" and resetting the counter to zero each time timing signal "C" occurs first.

To this end, signal "A" is supplied to a first inverter I1 the output of which is connected to an input of a NAND gate G2 the output of which is connected to the reset terminal R of counter CR4. Signal "A" is further supplied to one input terminal of a NAND gate G3 the output of which is connected to the input terminal CE of the counter. Timing pulse signal "C" is supplied to a second inverter I2 the output of which is connected to the second input terminal of each of NAND gates G2 and G3. When the negative pulse "C" occurs, the negative transition of the pulse drives the output of inverter I2 high thereby supplying a high level to the corresponding input terminal of each of gates G2 and G3. If signal "A" had occurred prior to "C," signal "A" would have previously supplied a high signal to the other input terminal of gate G3. Consequently, the later arrival of signal "C" would drive the output of gate G3 low to increment the counter by one count. On the other hand, if signal "A" had followed signal "C," NAND gate G2 would have been conditioned to supply a reset pulse to reset terminal R of counter CR4 upon the earlier occurrence of signal "C."

FIG. 2 illustrates the timed relationship between the signals "C," "B," "G2" (reset signal from gate G2), and "LOAD" for the case in which the pulse count value for a current sampling exceeds the pulse count value for the prior sampling. In such case timing signal "A" occurs later than "B," counter CR4 is reset by "G2," and "LOAD*" is generated upon occurrence of "A." The figure also illustrates signals "C," "B," "G3," and "LOAD*" for the alternate case in which the pulse count value for the current sampling is less than the pulse count value for the prior sampling. In such case timing signal "B" occurs later than "A," counter CR4 is incremented one count by "G3," and "LOAD" is generated upon occurrence of "B."

With the foregoing arrangement, each time the pulse count value of a new conversion is less than the stored maximum pulse count value from a prior conversion, counter CR4 is incremented once. The counter is incremented in this manner to a predetermined number which defines the occurrence of a peak. In the preferred embodiment counter CR4 is a divide by four counter which supplies an output signal after four consecutive input pulses indicative that four successive samplings have occurred with pulse count values less than the stored maximum prior pulse count value. However, it only takes one occurrence of a currently sampled value greater than the prior stored value to reset the counter to zero thereby starting the counting process again. This arrangement is particularly useful when the input signal is minimal and the signal-to-noise ratio is the least. For instance, when the analog signal is in primarily an increasing mode, small disturbances may be detected as a peak. With the present arrangement, by adjusting the divide ratio of counter CR4 and hence adjusting the predetermined number of consecutive pulses to define a peak, these small disturbances are not detected as peaks.

On the other hand, if the analog signal was decreasing, the original peak value thereof would be retained.

The arrangement of FIG. 1 includes certain logic features for adapting the peak detecting arrangement of the invention for use with conventional analog-to-digital converters and for selectively enabling the peak detection arrangement so that the converter and display 10 can otherwise follow all variations in the analog signal without retaining and displaying only a peak value thereof. These include additional flip-flops FF3 and FF4 and a one-shot multivibrator 14. FF3 is an SR-type flip-flop having its set input terminal S connected to the output terminal of one-shot 12, and its $\overline{Q}$-terminal connected as a triggering input to one-shot 14. A reset terminal R of FF3 is coupled to the system clock. The output terminal of one-shot 14 is connected to the set input terminal of FF4. The reset terminal of FF4 receives the "CONVERT" signal and its Q output terminal supplies a "BUSY*" signal. The "BUSY*" signal is coupled to the reset terminals R of counters CR1–CR3 and state counter SC1, to the reset terminal R of FF1, and to the clock terminal CK of FF2. The sequence of pulses generated by FF3, one-shot 14, and FF4 occur after every conversion and function to control the orderly transfer of counts from counter CR1–CR3 to registers SR1–SR3, to reset counters CR1–CR3 and SC1, and to signal that the system is ready for another conversion. In this regard, the "LOAD*" pulse from one-shot 12 sets FF3 and conditions FF3 such that upon occurrence of the next clock pulse "CL" at its reset terminal R the output of FF3 is driven high. The period of "LOAD*" pulse from one-shot is less than the period of a system clock pulse CL. Consequently, the output of FF3 goes high only after the "LOAD*" pulse transfers the contents of counters CR1–CR3 to registers SR1–SR3. One-shot 14 responds to the output from FF3 to supply a pulse to the set terminal S of FF4 which drives the Q output terminal of FF4 high to supply the "BUSY*" signal which resets counters CR1–CR3 and SC1. Consequently, these counters are not reset until the count therein has been transferred to registers SR1–SR3. Thereafter, when the pulse input to the set terminal S of FF4 is removed, the "CONVERT" pulse at the reset terminal thereof drives the $\overline{Q}$ output terminal thereof low to indicate that the system is ready for a subsequent conversion.

FF2 is a D-type flip-flop having its set terminal S connected to the $\overline{Q}$ output terminal of FF1, its D input terminal receiving a "PEAK ENABLE" signal and its clock terminal CK receiving the "BUSY*" signal. The Q output terminal of FF2 supplies the second timing signal "B" illustrated in FIG. 2 and discussed previously.

In operation, the peak detecting mode of the present apparatus is selected by supplying a high "PEAK ENABLE" signal to the D input terminal of FF2 at the same time the "CONVERT" signal goes high. The high "CONVERT" at FF4 causes "BUSY*" to go low which causes "B" to go low and enables counters CR1–CR3 and SC1. The counters then proceed to generate timing and control signals "ZERO," "INPUT," and "COUNT REFERENCE" for sampling the analog input signal and deriving a pulse count value indicative thereof. As successive samplings are taken, the maximum pulse count value is retained in storage registers SR1–SR3 in the manner previously described.

On the other hand, for the apparatus to function as a normal converter without peak detection, the "PEAK ENABLE" signal is held low. As a result, occurrence of the "BUSY*" signal initiating the conversion operation clocks flip-flop FF2 to set the Q output terminal thereof, and hence signal "B," high. Consequently, signal "B" is also high at the input of one-shot multivibrator 12. Therefore one-shot 12 is conditioned to generate an output "LOAD*" pulse upon the occurrence of signal "A" at the end of the "COUNT REFERENCE" interval. This loads the current pulse count value in counters CR1–CR3 for the current sampling into storage registers SR1–SR3. Consequently, storage registers SR1–SR3 are always loaded with the current value and hence these registers and display 10 follow the variations in the analog signal without retaining a peak value.

It will thus be seen that the peak detecting apparatus of the current invention is campatible and adapted for use with conventional analog-to-digital converters without the need for additional storage capacity or extensive additional control circuitry and logic. The peak detecting is accomplished with counters CR1–CR3 otherwise necessary for counting and timing control and with storage registers SR1–SR3 which additionally perform the buffer storage function required for display 10. While a preferred embodiment of the invention has been illustrated and described, it will be apparent that modifications may be made therein without departing from the spirit and scope of the invention as defined by the appended claims.

What is claimed is:

1. In combination with apparatus for measuring an analog signal of the type which includes converter means for sampling said analog signal at successive times having counting means for counting pulses from a source of digital pulses during time intervals following each sampling time to provide a digital pulse count of the amplitude value for each sample of said analog signal and for generating a first timing signal upon the completion of each digital pulse count, said counting means being adapted to continue to count beyond the value of said digital pulse count, apparatus for detecting peak values of said analog signal comprising:

register means for (1) storing a prior digital pulse count corresponding to an amplitude value of said analog signal at a prior sampling time, (2) recounting said prior count, and (3) generating a second timing signal when said recount is completed;

means responsive to a current sampling of said analog signal for enabling said register means to recount said prior digital pulse count simultaneous with said counting means counting toward the current digital pulse count for the current sample of said analog signal; and means responsive to the later occurring of said first and second timing signals for storing the digital pulse count then attained by said counting means in said register means, whereby the digital pulse count stored in said register means is always the greater of said prior digital pulse count and said current digital pulse count.

2. The apparatus of claim 1 wherein said means responsive includes means for signaling the occurrence of a peak when said first timing signal precedes said second timing signal a predetermined number of successive times.

3. The apparatus of claim 1 further including display means connected to said register means for displaying the digital pulse count contents of said register means.

4. For use with apparatus for measuring an analog signal of the type which includes converter means for sampling said analog signal at successive times having counting means for counting pulses from a source of digital pulses during time intervals following each sampling time to provide a digital pulse count of the amplitude value for each sample of said analog signal and for generating a first timing signal upon the completion of each digital pulse count, said counting means being adapted to continue to count beyond the value of said digital pulse count, a method of detecting peak values of said analog signal comprising the steps of:

storing a prior digital pulse count corresponding to an amplitude value of said analog signal for a prior sampling time;

counting a current sampling of said analog signal while simultaneously recounting the stored prior digital pulse count;

generating a second timing signal when said recounting is completed;

storing the count in said counting means in response to the later of the first and second timing signals;

outputting the latter stored pulse count value as a peak value of the analog signal when said second timing signal is the later of said first and second timing signals for a predetermined number of consecutive sampling times of said analog signal.

* * * * *